(12) United States Patent
Bibes et al.

(10) Patent No.: US 11,551,749 B2
(45) Date of Patent: Jan. 10, 2023

(54) NEUROMIMETIC NETWORK AND RELATED PRODUCTION METHOD

(71) Applicants: Universite Paris-Saclay, Saint-Aubin (FR); Thales, Courbevoie (FR); Centre National De La Recherche Scientifique, Paris (FR)

(72) Inventors: Manuel Bibes, Palaiseau (FR); Julie Grollier, Palaiseau (FR); Vincent Garcia, Palaisean (FR); Nicolas Locatelli, Orsay (FR)

(73) Assignees: UNIVERSITE PARIS-SACLAY, Gif-sur-Yvette (FR); THALES, Courbevoie (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 362 days.

(21) Appl. No.: 16/768,549

(22) PCT Filed: Nov. 30, 2018

(86) PCT No.: PCT/EP2018/083087
§ 371 (c)(1),
(2) Date: May 29, 2020

(87) PCT Pub. No.: WO2019/106127
PCT Pub. Date: Jun. 6, 2019

(65) Prior Publication Data
US 2020/0294581 A1    Sep. 17, 2020

(30) Foreign Application Priority Data
Nov. 30, 2017   (FR) ..................... 17 01263

(51) Int. Cl.
*G06N 3/04* (2006.01)
*G06N 3/06* (2006.01)
(Continued)

(52) U.S. Cl.
CPC ............... *G11C 11/54* (2013.01); *G06N 3/04* (2013.01); *G06N 3/049* (2013.01); *G06N 3/061* (2013.01);
(Continued)

(58) Field of Classification Search
CPC ......... G11C 11/54; G11C 11/223; G06N 3/04; G06N 3/049; G06N 3/061; G06N 3/063;
(Continued)

(56) References Cited

U.S. PATENT DOCUMENTS

| 6,121,647 A | 9/2000 | Yano et al. |
| 2011/0119214 A1* | 5/2011 | Breitwisch ............ H01L 27/285 706/33 |

(Continued)

FOREIGN PATENT DOCUMENTS

| WO | WO 2010/142762 A1 | 12/2010 |
| WO | WO 2017/039611 A1 | 3/2017 |

OTHER PUBLICATIONS

French Search Report issued by the French Patent Office in corresponding French Patent Application No. 1701263, dated Jul. 24, 2018.
(Continued)

*Primary Examiner* — Ly D Pham
(74) *Attorney, Agent, or Firm* — ArentFox Schiff LLP (57) ABSTRACT

The present invention relates to a neuromimetic network comprising a set of neurons and a set of synapses,
at least one neuron comprising a first stack of superimposed layers, the first stack successively comprising:
a first electrode,
a first barrier layer made of an electrically insulating material, and
a second electrode,
the first electrode, the first barrier layer and the second electrode forming a first ferroelectric tunnel junction,
(Continued)

at least one synapse comprising a second stack of superimposed layers, the second stack successively comprising:
  a third electrode,
  a second barrier layer made of an electrically insulating material, and
  a fourth electrode,
the third electrode, the second barrier layer and the fourth electrode forming a second ferroelectric tunnel junction.

10 Claims, 6 Drawing Sheets

(51) Int. Cl.
  G06N 3/063        (2006.01)
  G11C 11/22        (2006.01)
  G11C 11/54        (2006.01)
  H01L 27/11585     (2017.01)
  H01L 29/51        (2006.01)

(52) U.S. Cl.
  CPC ........... *G06N 3/063* (2013.01); *G06N 3/0635* (2013.01); *G11C 11/223* (2013.01); *H01L 27/11585* (2013.01); *H01L 29/516* (2013.01); *H01L 2924/1441* (2013.01)

(58) Field of Classification Search
  CPC .......... G06N 3/0635; H01L 27/11585; H01L 29/516; H01L 2924/1441
  USPC ........................................................... 706/26
  See application file for complete search history.

(56) References Cited

U.S. PATENT DOCUMENTS

| | | |
|---|---|---|
| 2014/0365413 A1 | 12/2014 | Rangan |
| 2017/0193356 A1* | 7/2017 | Park ................... G06N 3/0635 |
| 2018/0082177 A1* | 3/2018 | Boybat Kara ......... G06N 3/049 |
| 2020/0005865 A1* | 1/2020 | Burr ..................... G06N 3/049 |
| 2021/0026601 A1* | 1/2021 | Kobayashi ............. H01L 45/10 |

OTHER PUBLICATIONS

Grollier, J. et al., "Spintronic Nanodevices for Bioinspired Computing", Proceedings of the IEEE, IEEE. Newyork< US, XP011623647, vol. 104, No. 10, pp. 2024-2039, (Sep. 19, 2016).

International Search Report issued by the International Searching Authority corresponding to International Patent Application No. PCT/EP2018/083087, dated Dec. 17, 2018.

Safin, A., et al., "Generation of Microwave Oscillations in a Current-driven Magnetic Nanocontact Ferroelectric and Multiferroic Junction", Progress in Electromagnetic Research Symposium (PIERS), XP032997279, pp. 2834-2837, (Aug. 8, 2016).

* cited by examiner

NEUROMIMETIC NETWORK AND RELATED PRODUCTION METHOD

CROSS-REFERENCE TO RELATED APPLICATIONS

This application is a National Stage entry of International Application No. PCT/EP2018/083087, filed on Nov. 30, 2018, which claims priority to French Patent Application No. 1701263, filed on Nov. 30, 2017. The disclosures of the priority applications are hereby incorporated in their entirety by reference.

BACKGROUND OF THE INVENTION

The present invention relates to a neuromimetic network. The present invention also relates to a method for manufacturing such a neuromimetic network.

Networks reproducing the working of a human brain are used for specific tasks for which the conventional architectures, such as the Von Neumann architectures, are not very suitable. For example, such tasks comprise the recognition of objects or persons in images.

Such networks comprise two main types of components or circuits performing two separate functions. A first type of component has an oscillator behavior similar to that of a neuron, and a second type of component, having a controllable resistance, serves as synapse connecting two neurons to one another. For this reason, networks of this type are called "neuromimetic networks", neural networks" or "neuromorphic networks".

Neuromorphic networks are frequently digitally emulated, that is to say, their functions are reproduced by a computer program. However, such networks then assume the use of a computer having a conventional, complex architecture, even if the emulated neuromorphic network is simple.

Neuromorphic networks in which the roles of neurons and synapses are played by dedicated physical components are also known. For example, the synapses comprise controllable resistors of the memristor type, using materials such as phase change materials, oxides or ferroelectric tunnel junctions. Such synapses have a variable electrical resistance making it possible to modify the connection between two neurons, and thus to control the propagation of the electrical pulses between neurons. The neurons, in turn, are frequently made from conventional technologies in silicon-based microelectronics, in particular CMOS (Complementary Metal-Oxide Semiconductor) technology.

However, the manufacture of such a neuromorphic networks is complex. In particular, the interfacing between the synapses and the neurons is difficult. Furthermore, the technologies for manufacturing neurons and synapses are very different, and it is difficult to integrate neurons and synapses on a same substrate. The obtained density of components is therefore relatively low, and the neuromorphic networks therefore have, within equal surface, a relatively low computing capacity relative to a conventional architecture.

There is therefore a need for a neuromorphic network having a computing capacity per surface unit that is higher than the neuromorphic networks of the state of the art.

SUMMARY OF THE INVENTION

To that end, proposed is a neuromimetic network comprising a substrate, a set of neurons and a set of synapses, at least one neuron comprising a first stack of superimposed layers in a first stacking direction, the first stack successively comprising, in the first stacking direction:
a first electrode supported by the substrate,
a first barrier layer made of an electrically insulating material, and
a second electrode,
the first electrode, the first barrier layer and the second electrode forming a first ferroelectric tunnel junction,
at least one synapse comprising a second stack of superimposed layers in at least a second stacking direction, the second stack successively comprising, in the second stacking direction:
a third electrode supported by the substrate,
a second barrier layer made of an electrically insulating material, and
a fourth electrode,
the third electrode, the second barrier layer and the fourth electrode forming a second ferroelectric tunnel junction.

According to specific embodiments, the neuromorphic network comprises one or more of the following features, considered alone or according to any technically possible combinations:
the first barrier layer is made of a ferroelectric material and has a single-pole polarization cycle.
the first barrier layer is made of an anti-ferroelectric material.
the second barrier layer is made of a ferroelectric material made up of atoms of a set of elements and the anti-ferroelectric material making up the first barrier layer comprises atoms of each element from the set of elements, the anti-ferroelectric material further comprising atoms of an additional element not belonging to the set of elements.
the first electrode is made from a first conductive material and the second electrode is made from a second conductive material different from the first conductive material.
at least one neuron comprises an electro-resistive component having a variable electrical resistance, the electro-resistive component being electrically connected to an electrode of the corresponding first stack, the neuron being configured to receive an electric current passing through the electro-resistive component, the electric current further successively passing through all of the layers of the first stack in the first stacking direction.

Also proposed is a method for manufacturing a neuromimetic network comprising a substrate, a set of neurons and a set of synapses, the manufacturing method comprising the following steps:
obtaining a first set of first electrodes supported by the substrate, and a second set of electrodes, called third electrodes, supported by the substrate,
depositing an electrically insulating barrier layer on each first electrode and each third electrode,
forming an electrode, called second electrode, on each barrier layer of the first set to form a set of neurons, and forming a fourth electrode on each barrier layer of the second set to form a set of synapses, each barrier layer forming, with the corresponding electrodes, a ferroelectric tunnel junction.

According to specific embodiments, the method comprises one or more of the following features, considered alone or according to any technically possible combinations:
each barrier layer deposited during the depositing step is made from a ferroelectric material, the manufacturing method further comprising, before the forming step, a step for inserting atoms of at least one additional element into each barrier layer of the first set in order to transform the ferroelectric material of the barrier layers of the first set into an anti-ferroelectric material.

the insertion step comprises implanting atoms of the additional element into each barrier layer of the first set.

the forming step comprises:
depositing an electrically conductive material, called second conductive material, on each barrier layer of the first assembly in order to form the corresponding second electrode, and
depositing an electrically conductive material, called third conductive material, on each barrier layer of the second set in order to form the corresponding fourth electrode, the third conductive material being different from the second conductive material.

BRIEF DESCRIPTION OF THE DRAWINGS

Features and advantages of the invention will appear more clearly upon reading the following description, provided solely as a non-limiting example, and done in reference to the appended drawings, in which.

DETAILED DESCRIPTION OF PREFERRED EMBODIMENTS

Figure 1:
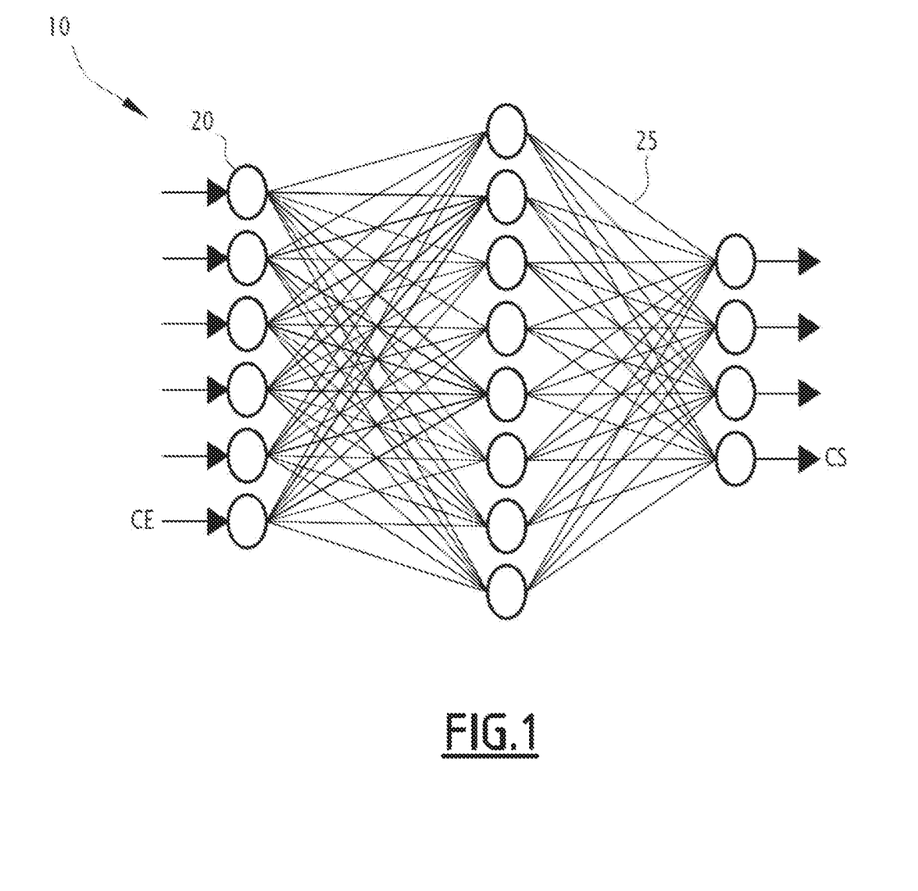
FIG. 1 is a partial schematic illustration of an exemplary neuromimetic network comprising a set of neurons and a set of synapses.

An exemplary neuromimetic network 10 has been shown in FIG. 1.

The neuromimetic network 10 includes a substrate 15, a set of neurons 20, and a set of synapses 25.

The neuromimetic network 10 is configured to receive at least one electric input current CE and to generate, in response, at least one electric output current CS.

The neuromimetic network 10 is configured so that each electric input current CE is distributed over the set of neurons 20 by the set of synapses 25, each electric output current CS being obtained at the output of at least one neuron 20.

The substrate 15 is configured to support the set of neurons 20 and the set of synapses 25. For example, the substrate 15 has a flat upper face 30. The upper face 30 is perpendicular to a direction called normal direction DN.

The substrate 15 is made from an inorganic crystalline material. For example, the substrate 15 is made from a material selected from Si, SiO2, Al2O3, SrTiO3, MgO, NdGaO3, GdScO3, YaAlO3, LaAlO3 and mica.

According to a variant, the substrate 15 is made from a non-crystalline inorganic material such as a glass or a ceramic.

According to a variant, the substrate 15 is made from an organic material such as a plastic material.

The substrate 15 for example includes additional elements such as a set of electric interconnects, one or several power supplies from the neuromimetic network 10 or means for programming the neuromimetic network 10.

All or some of the additional elements are for example supported by a lower face of the substrate 15.

The additional elements are for example made using a CMOS technology.

Each neuron 20 is configured to be passed through by an electric current C.

Each neuron 20 includes a first stack 35 of layers superimposed in a first stacking direction D1.

The first stack 35 is configured to be passed through by an electric current C in the first stacking direction D1.

The first stacking direction D1 is for example parallel to the normal direction DN.

Figure 2:
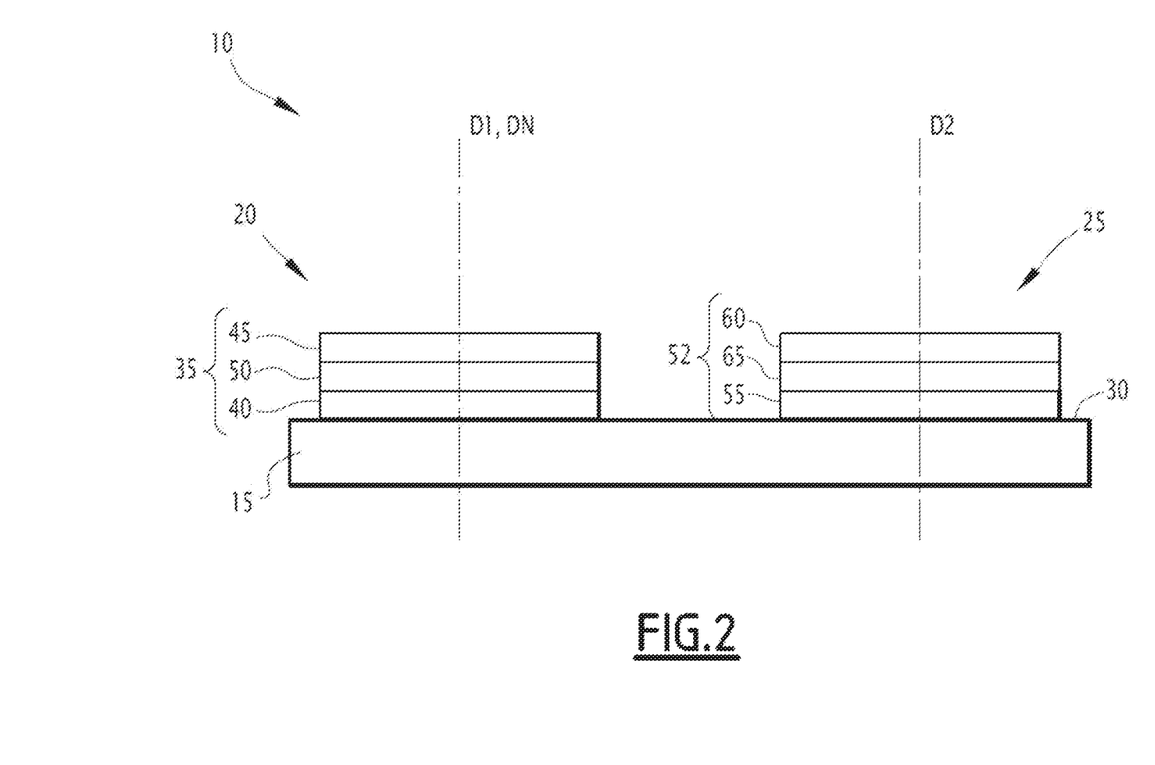
FIG. 2 is a schematic partial sectional view of a neuron and a synapse of FIG. 1, comprising neuroelectric tunnel junctions.

An exemplary first stack 35 has been shown in FIG. 2.

The first stack 35 includes a first electrode 40, a second electrode 45 and a first barrier layer 50.

The first electrode 40 is supported by the substrate 15.

The first electrode 40 is delimited, in the first stacking direction D1, by the upper face 30 of the substrate 15 and by the first barrier layer 50.

The first electrode 40 is planar. The first electrode 40 has a first thickness e1 measured in the first stacking direction D1. The first thickness e1 is for example between 1 nm and 100 nm.

The first electrode 40 is made from a first conductive material M1. "Conductive material" refers to an electrically conductive material.

The first conductive material M1 is for example a metal material. According to one embodiment, the first material M1 is platinum.

The second electrode 45 is supported by the first barrier layer 50. The second electrode 45 has a second thickness e2 measured along the first stacking direction D1. The second thickness e2 is between 5 mm and 100 mm.

The second electrode 45 is made from a second conductive material M2. The second conductive material M2 is for example a metal material. The second conductive material M2 is different from the first conductive material M1.

The first barrier layer 50 is delimited, in the first stacking direction D1, by the first electrode 40 and by the second electrode 45.

The first barrier layer 50 has a third thickness e3, measured in the first stacking direction D1. The third thickness e3 is between one nanometer and five nanometers.

The first barrier layer 50 is able to form a barrier between the first electrode 40 and the second electrode 45. Thus, the first barrier layer 50 is made of an electrically insulating material.

The first barrier layer 50 is configured so that the first electrode 40, the first barrier layer 50 and the second electrode 45 form a first ferroelectric tunnel junction. This means that the first barrier layer 50 is configured to be passed through by tunnel effect by an electric current C successively passing through the first electrode 40, the first barrier layer 50 and the second electrode 45, and the first barrier layer 50 is made from a ferroelectric material or an anti-ferroelectric material.

More specifically, the first barrier layer 50 is made of a ferroelectric material MF . . . "Ferroelectric" means that the ferroelectric material MF has a plurality of electric dipoles each generating an electric moment, and, in the absence of outside electric field, the first barrier layer 50 has a non-nil electric polarization PE.

The electric polarization PE is defined as the average, per unit of volume, of the electric moments. The electric polarization PE is therefore a vectorial property. Thus, in a ferroelectric material, the barycenter of the positive charges and the barycenter of the negative charges in a barrier layer of a ferroelectric tunnel junction are not combined, even in the absence of outside electric field.

The electric polarization PE is parallel to the first direction D1.

The electric polarization PE is variable. In particular, the electric polarization PE may be modified by a difference in potential V applied between the electrodes of a ferroelectric tunnel junction. For example, the electric polarization PE is mobile between a first orientation and a second orientation of opposite direction with respect to the first orientation.

The electric polarization PE has a polarization value P. The absolute value of the polarization value P is equal to a norm of the electric polarization PE, and the sign of the polarization value P is positive if the electric polarization PE has the first orientation and negative if the electric polarization PE has the second orientation.

A representation of the variation of the electric polarization PE or of the polarization value P as a function of the difference in potential V is called "polarization cycle".

When the barrier layer of a ferroelectric tunnel junction is made from a ferroelectric material MF, the polarization value P can vary between a first extreme value ve1 and a second extreme value ve2.

For example, the first extreme value ve1 and the second extreme value ve2 have identical absolute values, but different signs.

An electrical resistance R is defined for each ferroelectric tunnel junction. In a ferroelectric tunnel junction, the electrical resistance R depends on the polarization value P.

When the polarization value P is equal to the first extreme value ve1, a first resistance value Roff is defined for the considered ferroelectric tunnel junction.

In the case of the first stack 35, the first resistance value Roff is, for example, between 100 KiloOhm (kOhm) and 100 gigaOhm (GOhm).

When the polarization value P is equal to the second extreme value ve2, a second resistance value Ron is defined for the considered ferroelectric tunnel junction. The second resistance value Ron is strictly less than the first resistance value Roff.

In the case of the first stack 35, the second resistance value Roff is, for example, between 100 Ohm and 100 kOhm.

The polarization cycle of each ferroelectric tunnel junction has a hysteresis, that is to say, the ferroelectric tunnel junction tends to remain in a certain state when the outside cause that has produced the state change has ceased.

In particular, two states are defined for each ferroelectric tunnel junction.

In a first state, the polarization value P is equal to the first extreme value ve1. In a second state, the polarization value P is equal to the second extreme value ve2.

A first coercive voltage Vc1 and a second coercive voltage Vc2 are defined for each ferroelectric tunnel junction.

When the ferroelectric tunnel junction in question is in the first state, and the difference in potential V is increased gradually, the considered ferroelectric tunnel junction switches to the second state when the difference in potential V reaches the first coercive voltage Vc1.

When the ferroelectric tunnel junction in question is in the second state, and the difference in potential V is decreased gradually, the considered ferroelectric tunnel junction switches to the first state when the difference in potential V reaches the second coercive voltage Vc2.

The first coercive voltage Vc1 is strictly greater than the second coercive voltage Vc2. Thus, there is a range of differences in potential V for which the ferroelectric tunnel junction in question may have either the first extreme value ve1 or the second extreme value ve2.

The first stack 35 is configured so that the first barrier layer 50 has a single-pole polarization cycle.

Figure 3:
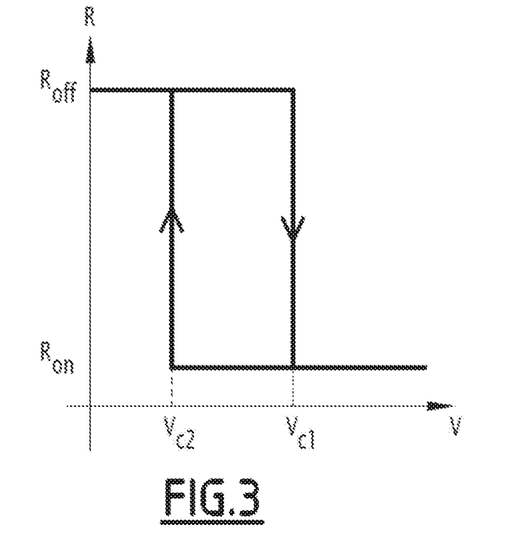
FIG. 3 is a graph showing the variation of the electrical resistance of an exemplary ferroelectric tunnel junction of FIG. 2.

"Single-pole polarization cycle" means that the two coercive voltages Vc2, Vc1 have the same sign. One such exemplary cycle is shown in FIG. 3.

When the two coercive voltages Vc2, Vc1 have opposite signs, the polarization cycle is said to be "bipolar".

Figure 4:
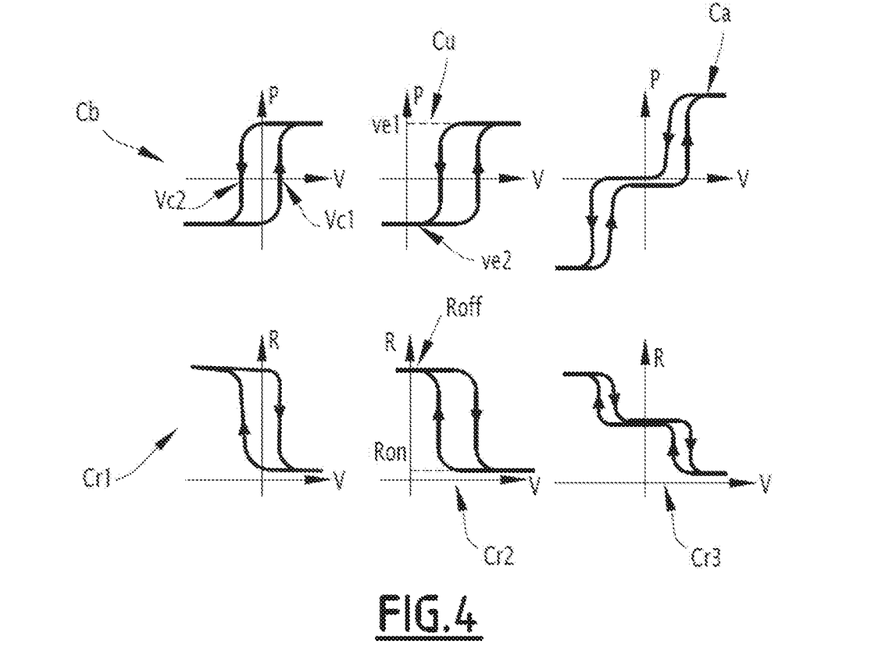
FIG. 4 is a set of graphs showing exemplary polarization and ferroelectric tunnel junction resistance cycles.

An example bipolar polarization cycle Cb and an example single-pole polarization cycle Cu are shown in FIG. 4 for comparison. An example cycle Cr1 describing the variation of the electrical resistance R during the bipolar polarization cycle Cb and an example cycle Cr2 describing the variation of the electrical resistance R during the single-pole polarization cycle Cu are also shown in FIG. 4.

A graph showing the variation of the resistance R of a ferroelectric tunnel junction having a single-pole polarization cycle, in which the first and second resistance values Ron, Roff and the first and second coercive voltages Vc1, Vc2 are indicated, is shown in FIG. 4.

For example, the first conductive material M1 and the second conductive material M2 are chosen so that the polarization cycle of the first barrier layer 50 is unipolar. For example, the first conductive material M1 has a first work function, the second conductive material M2 has a second work function and the difference between the first work function and the second work function is greater than or equal to the difference between the two coercive voltages Vc2, Vc1.

A first stack 35 in which the first material M1 is $SrRuO_3$, the ferroelectric material is $BaTiO_3$ and the second material M2 is Al is an example of first stack having a single-pole polarization cycle.

In a variant, the first conductive material M1 and the second conductive material M2 have different electrical conductivities.

According to another variant, the first conductive material M1 and the second conductive material M2 have different crystalline structures.

Each synapse 25 is configured to receive the electrical current C from a neuron 20, and to transmit the electrical current C to a second neuron 20.

Each synapse 25 includes a second stack 52 of layers superimposed in a second stacking direction D2. The second stacking direction D2 is parallel to the first stacking direction D1.

The second stack 52 is configured to be passed through by the electrical current C in the second stacking direction D2.

The second stack 52 includes a third electrode 55, a fourth electrode 60, and a second barrier layer 65.

The second stack 52 is connected to the first stacks 35 of the two corresponding neurons 20. For example, the third electrode 55 is connected to the second electrode 45 of one of the neurons 20 and the fourth electrode 60 is connected to the first electrode 40 of the other considered neuron 20.

The third electrode 55 is supported by the substrate 15. In particular, the third electrode 55 is delimited, in the second stacking direction D2, by the upper face 30 of the substrate 15 and by the second barrier layer 65.

The third electrode 55 is made from an electrically conductive material. For example, the third electrode 55 is made from the first conductive material M1.

The third electrode 55 has a fourth thickness e4. The fourth thickness e4 is identical to the first thickness e1.

Each fourth electrode 60 is supported by the corresponding second barrier layer 65. Each fourth electrode 60 is made from a third conductive material M3.

The third conductive material M3 is different from the second conductive material M2. For example, the third conductive material M3 is identical to the first conductive material M1.

The fourth electrode 60 has a fifth thickness e5. The fifth thickness e5 is between 5 nanometers and 100 nanometers.

The second barrier layer 65 is configured so that the third electrode 55, the second barrier layer 65 and the fourth electrode 60 form a second ferroelectric tunnel junction.

The second barrier layer 65 is made of a ferroelectric material. For example, the second barrier layer 65 is made from the same ferroelectric material MF as the first barrier layer 50.

According to a variant, the ferroelectric materials are different from one another.

The second barrier layer 65 has a sixth thickness e6, measured in the second stacking direction D2. The sixth thickness e6 is identical to the third thickness e3.

The second stack 52 is configured so that the second barrier layer 65 has a double-pole polarization cycle. In particular, the second stack 52 has a memristor electrical behavior.

Figure 5:
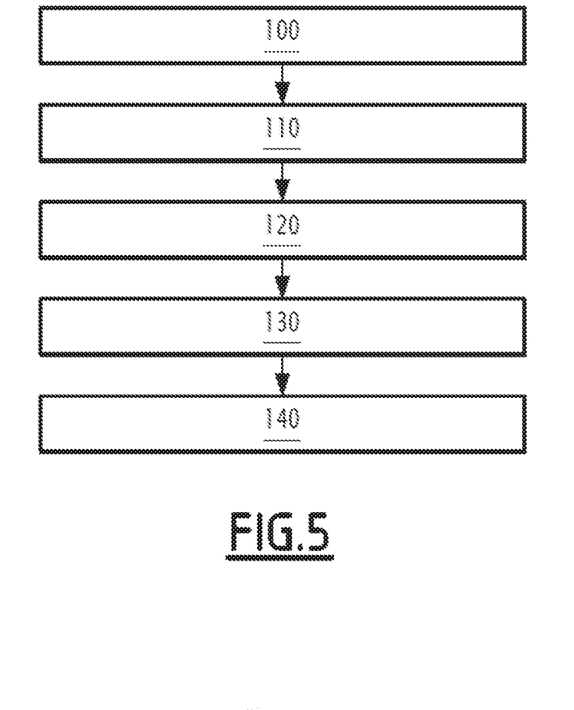
FIG. 5 is a flowchart of the steps of a method for manufacturing the neuromimetic network of FIG. 1.

A flowchart of the steps of a method for manufacturing a neuromimetic network 10 has been shown in FIG. 5.

The manufacturing method comprises an obtaining step 100, a depositing step 110, a step 120 for forming a second electrode 45, a step 130 for forming a fourth electrode 60, and a finalizing step 140.

During the obtaining step 100, a first set of first electrodes 40 and a second set of second electrodes 55 are obtained.

For example, the first electrodes 40 and the third electrodes 55 are obtained by depositing the first material M1 on the upper face 30 of the substrate 15. Molecular beam epitaxy, vacuum evaporation, pulsed laser deposition, cathode sputtering, spin coating, chemical vapor deposition or atomic layer deposition are examples of deposition methods that can be used to deposit layers of material.

During the deposition step 110, a barrier layer 50, 65 is deposited on each first electrode 40 and on each third electrode 55.

For example, the ferroelectric material MF is deposited on each first electrode 40 in order to form a corresponding first barrier layer 50, and on each third electrode 55 in order to form a corresponding second barrier layer 65.

During the step 120 for forming a second electrode 45, the second conductive material M2 is deposited on each first barrier layer 50 of the first set.

The second conductive material M2 is not deposited on the second barrier layers 65 of the second set. For example, during the step 120 for forming a second electrode 45, each second barrier layer 65 of the second set is covered with a layer of resin preventing the deposition of the second conductive material M2 on the second barrier layer 65.

At the end of step 120 for forming a second electrode 45, the resin covering the second barrier layers 65 is removed, for example by dissolution in a chemical bath.

During step 130 for forming a fourth electrode 60, a fourth electrode 60 is formed on each second barrier layer 65.

For example, the third conductive material M3 is deposited on each second barrier layer 65 of the second set in order to form a corresponding fourth electrode 60.

During the step 130 for forming a fourth electrode, each second electrode 45 is covered with a layer of resin preventing the deposition of the third conductive material M3 on the second conductive material M2.

Thus, at the end of the forming steps 120 and 130, a first set of neurons and a second set of synapses is obtained.

During the finalizing step 140, the resin still present on the substrate 15, or on one of the stacks 35, 52, is removed.

Furthermore, each synapse 25 is connected to at least two separate neurons 20. For example, the third electrode 55 of each synapse 25 is connected to at least one neuron 20 and the fourth electrode 60 of each synapse 25 is connected to at least one neuron 20.

According to one embodiment, the steps for obtaining 100, depositing 110, forming 120 a second electrode 45, forming 130 a fourth electrode 65, and a finalizing step 140 are carried out after manufacturing additional elements supported by the substrate 15. For example, steps 100 to 110 are carried out during a "back-end of line" phase of the manufacturing method of the neuromimetic network 10.

A "back-end of line" phase is the second phase of a method for producing an integrated circuit, following a first phase during which the nonmetallic portions of the transistors of the integrated circuit are formed. For example, the first phase comprises forming layers of oxides or nitrides, depositing semi-conductive layers, doping portions of semi-conductive layers or etchings.

During the "back-end of line" phase, the metal interconnects are formed inter alia.

Figure 6:
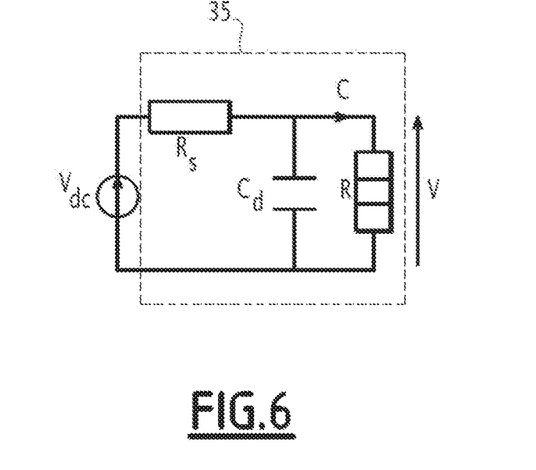
FIG. 6 is a diagram of an electric circuit equivalent to a neuron of FIG. 1.

A diagram of an electrical circuit equivalent to a first stack 35 is shown in FIG. 6. In FIG. 6, the first stack 35 has been shown electrically connected to a voltage source Vdc.

The first stack 35 is electrically equivalent to a circuit formed by a load resistor Rs placed in series with an ensemble formed by a capacitor having a capacitance Cd connected in parallel with the resistance R of the first ferroelectric tunnel junction.

The load resistor Rs corresponds to the electrical resistance of the first and second electrodes 40, 45.

The capacitor Cd corresponds to the capacitive behavior of the first stack 35, caused by the juxtaposition of the first and second metal electrodes 40, 45 separated by the first insulating barrier layer 50.

The resistance R of the first ferroelectric tunnel junction has a single-pole resistance cycle.

Figure 7:
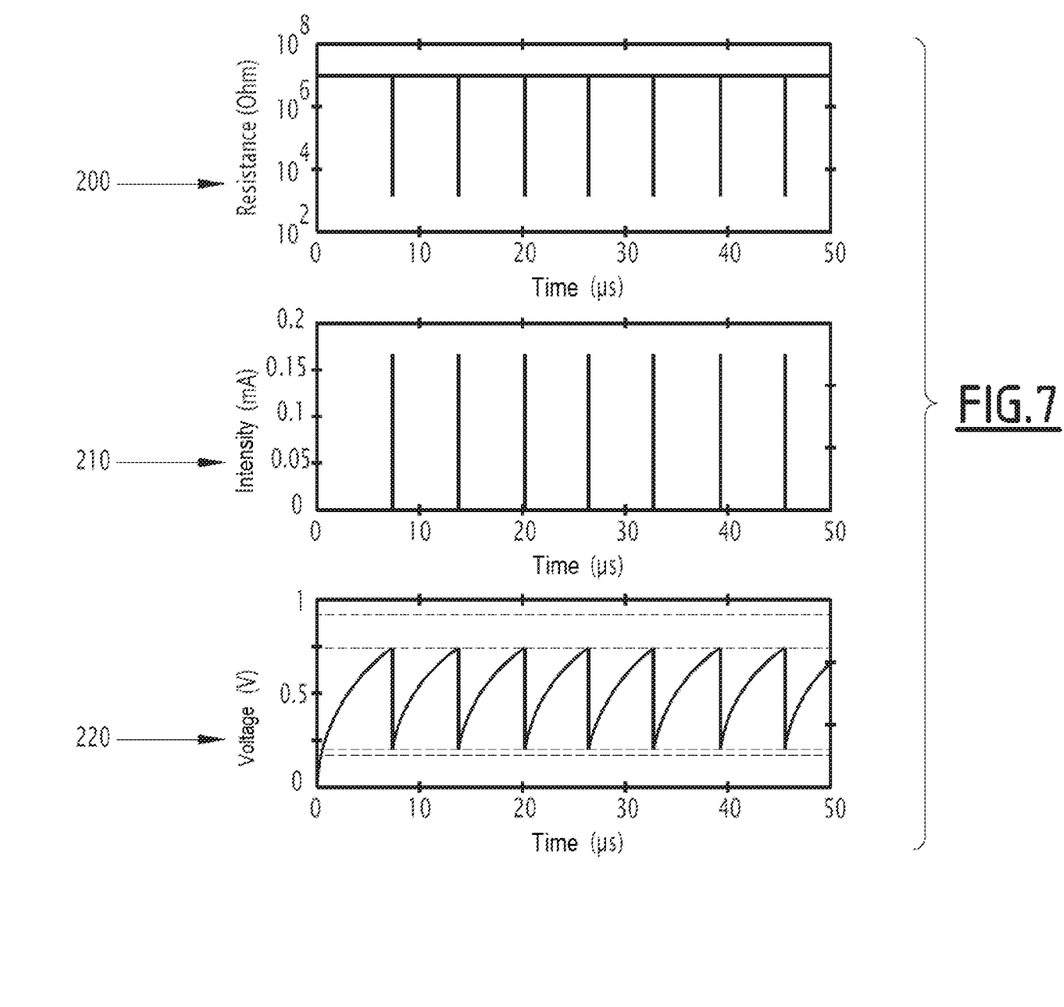
FIG. 7 is a set of graphs describing the variation over time of electrical parameters of the circuit of FIG. 6.

Results of simulations of the electrical properties of a first stack 35 are shown in FIG. 7.

The first stack 35 considered in the simulations has a first resistance value Roff equal to 10 megaohm, a second resistance value Ron equal to 1 kiloohm, a capacitance Cd equal to 450 femtofarad, a load resistance Rs equal to 5 kiloohm, a first coercive voltage Vc1 equal to 0.8 volt and a second coercive voltage Vc2 equal to 0.2 volts. During simulations, the voltage source Vdc imposes a difference in potential equal to 1 volt on the first stack 35.

The results of simulations include a graph 200 showing, on the y-axis, the variation over time of the resistance R (in Ohm) of the first ferroelectric tunnel junction, a graph 210 showing, on the y-axis, the variation over time of the intensity (in milliamperes) of the current C passing through the first stack 35, and a graph 220 showing, on the y-axis, the variation over time of the difference in potential V (in volts) between the first electrode 40 and the second electrode 45. The three graphs 200, 210 and 220 show a common graduated scale on the x-axis in microseconds.

The graphs 200 to 220 show that the first stack 35 has an oscillating behavior in which the resistance R, the intensity of the current C and the difference in potential V vary periodically over time with a frequency F.

More specifically, the first stack 35 behaves electrically like a relaxation oscillator. Such behavior is similar to that of a neuron. The first stack 35 is therefore suitable for serving as a neuron 20 in the neuromimetic network 10.

The neuromimetic network 10 is easier to manufacture than the neuromimetic networks of the state of the art. In particular, the neuromimetic network 10 does not assume combining synapses 25 and neurons 20 obtained from separate manufacturing technologies. On the contrary, the neurons 20 and the synapses 25 are formed directly on a same substrate 15. The neuromimetic network 10 is therefore easier to manufacture than the neuromimetic networks of the state of the art.

The neuromimetic network 10 further has a higher density of neurons 20 and synapses 25 than the neuromimetic networks of the state of the art.

Furthermore, the neurons 20 and the synapses 25 are not very sensitive to fatigue phenomena. The neuromimetic network 10 therefore has a better reliability than the neuromimetic networks of the state of the art and greater durability.

A second exemplary neuromimetic network 10 will now be described. The elements that are identical to the first exemplary neuromimetic network are not described here again. Only the differences are shown.

The first conductive material M1 is identical to the second conductive material M2.

Each first barrier layer 50 is made from an anti-ferroelectric material MA.

In an anti-ferroelectric material, the dipoles are oriented antiparallel relative to one another without completely offsetting one another.

In particular, the anti-ferroelectric material MA has an anti-ferroelectric behavior at nil voltage and a hysteretic transition toward a ferroelectric state at positive or negative voltage.

More specifically, when no difference in potential V is applied to the two electrodes 40, 45, the anti-ferroelectric material MA has a polarization value P of less than or equal to 5 microcoulomb per square centimeter.

When a difference in potential V is applied to the two electrodes 40, 45, the first ferroelectric tunnel junction has a behavior similar to the behavior of a ferromagnetic material having a single-pole polarization cycle.

More specifically, the polarization cycle of the first ferroelectric tunnel junction is similar to the union of two single-pole polarization cycles, one for the negative differences in potential V and the other for the positive differences in potential V.

One exemplary anti-ferroelectric polarization cycle Ca having a hysteretic transition to a ferroelectric state with positive or negative voltage is shown in FIG. 4. An exemplary cycle Cr3 describing the variation of the electrical resistance R during the anti-ferroelectric polarization cycle Ca is also shown in FIG. 4.

The ferroelectric material MF is made up of atoms of a set of elements. For example, the ferroelectric material MF is $BiFeO_3$. In this case, the set of elements is formed by oxygen, bismuth and iron.

The anti-ferroelectric material MA comprises atoms of each element from the set of elements. For example, the anti-ferroelectric material comprises bismuth atoms, oxygen atoms and iron atoms.

The anti-ferroelectric material MA further comprises atoms of at least one additional element not belonging to the set of elements. For example, the additional element is a rare earth.

The rare earth is for example a rare earth with valence 3. Samarium, neodymium, lanthanum, gadolinium and dysprosium are examples of rare earths with valence 3.

During the depositing step 110, each barrier layer 50, 65 is made from the ferroelectric material like in the first example.

A single forming step is carried out, during which the second electrodes 45 and the fourth electrodes 60 are made simultaneously.

The manufacturing method further comprises an insertion step. The insertion step is for example carried out between the depositing step 110 and the forming step 120.

During the insertion step, the ferroelectric material MF making up the first barrier layers 50 is transformed into an anti-ferroelectric material MA. For example, atoms of the additional element are inserted into each first barrier layer 35 of the first set in order to transform the ferroelectric material MF of each first barrier layer 35 into the anti-ferroelectric material MA.

The atoms of the additional element are for example inserted by implantation. Implantation (also called "ion implantation") is a technique in which ions of an element are accelerated and projected at a high speed onto a material in order to insert the ions into the material.

According to a variant, the atoms of the additional element are inserted by ionic diffusion. Ionic diffusion is a technique in which the material to be modified is placed in contact with the source material containing atoms of the additional element, the atoms of the additional element migrating from the source material to the material to be modified by diffusion.

According to a variant of the second example, the anti-ferroelectric material MA is made up of atoms of the same elements as the ferroelectric material MF, but in different proportions. The proportions of the atoms are then modified during the insertion step, that is to say, the additional element is an element from the set of elements.

According to a third example, at least one neuron 20 includes an electro-resistive component 70.

The electro-resistive component 70 is electrically connected to an electrode 40, 45 of the corresponding first stack 35.

The electro-resistive component 70 is configured to receive the electric current C. In particular, the electro-resistive component 70 is configured to be passed through by the electric current C.

For example, the electro-resistive component 70 is inserted between the synapse 25 and the first electrode 40. In a variant, the electro-resistive component 70 is inserted between a synapse 25 and the second electrode 45.

The electro-resistive component 70 has a variable electrical resistance Rv. The variable electrical resistance Rv can be modified by a user of the neuromimetic network 10.

The electro-resistive component 70 is for example a memristor. A ferroelectric memristor is one example of a memristor.

Figure 8:
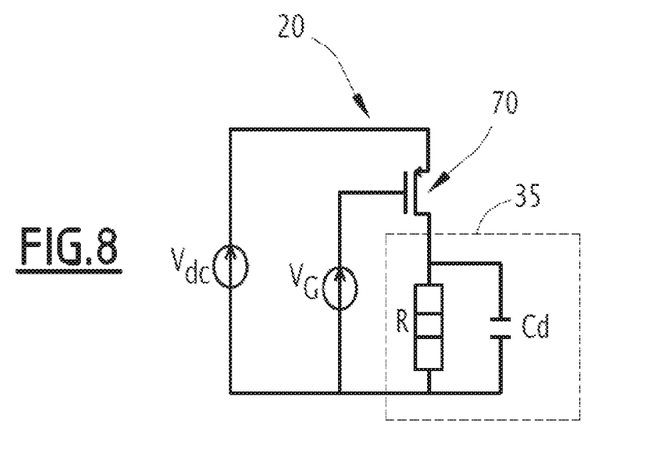
FIG. 8 is a diagram of an electrical circuit equivalent to another exemplary neuron.

An electrical diagram equivalent to the neuron 20 is shown in FIG. 8. The series resistance Rs is considered to be a component of the variable electrical resistance Rv and has therefore not been shown in FIG. 8.

In the example of FIG. 8, the electro-resistive component 70 is a transistor. For example, the electro-resistive component 70 is a transistor whose variable electrical resistance Rv can be modified as a function of a gate voltage Vg applied to the transistor.

Figure 9:
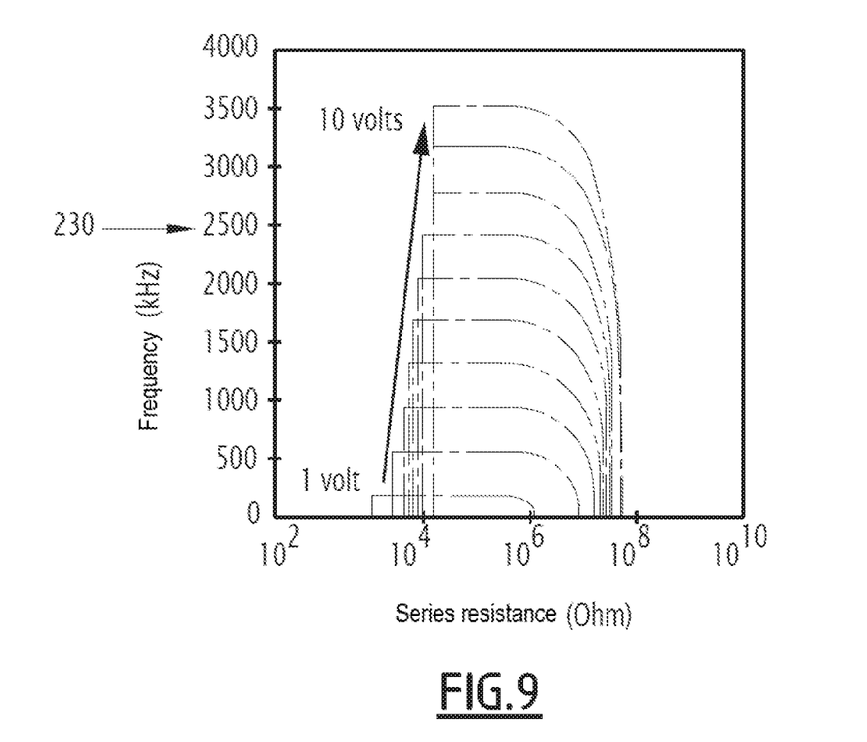
FIG. 9 is a graph showing the electrical behavior of the circuit of FIG. 8.

FIG. 9 shows a graph 230 showing the variation of the frequency F as a function of the variable electrical resistance Rv and of the direct voltage Vdc applied to the ensemble formed by the electro-resistive component 70 and the first stack 35 connected in series. As shown in the graph 230, the frequency F depends on the variable electrical resistance.

The neuromimetic network 10 is then adaptable to a wide range of uses.

In particular, the modulation of the series resistance Rs makes it possible to modify the frequency of the pulses emitted by the neurons.

For example, neurons 20 comprising such an electro-resistive component 70 form an input layer of the neuromimetic network 10, that is to say, the set of neurons 20 receiving the electrical input current(s) CE. In this case, the electro-resistive components 70 make it possible to code, for each neuron 20 of the input layer, analog input information in the form of a pulse frequency.

In the examples above, specific examples of materials have been given. It should be noted that other materials can be used.

For example, each of the first, second and third conductive materials M1, M2, M3 can be selected from the set made up of metals, conductive oxides and semi-conductive oxides.

Each metal is for example selected from the set made up of: Pt, Pd, Au, Co, W, Al, Ir, Cu, Ni and Cs.

Each conductive oxide is for example selected from the set made up of: $SrRuO_3$, $LaNiO_3$, (Ca, Ce)$MnO_3$, (La,Sr)$MnO_3$, $La_{0.5}Sr_{0.5}CoO_3$, $IrO_2$ and $RuO_2$.

Each semi-conductive oxide is for example selected from the set made up of: $ZnO$, $SnO_2$, $In_2O_3$ and ITO.

The semi-conductive oxide is for example doped.

Each anti-ferroelectric material is for example selected from the set made up of: $PbZrO_3$, $Pb(In,Nb)O_3$, $Pb_{1-x}Ba_xZrO_3$, $PbZr_{1-x}Sn_xO_3$, $PbHfO_3$, $Pb(In_{1/2}Nb_{1/2})O_3$, $Pb_{0.89}Nb_{0.02}[(Zr_{0.57}Sn_{0.43})_{0.94}Ti_{0.06}]_{0.98}O_3$, $(Bi,Y)FeO_3$, $(Bi,Sc)FeO_3$, solid solutions of type $(Bi, RE)FeO_3$ where RE with a rare earth with valence 3, $NaNbO_3$, $AgNbO_3$, $SmFeO_3$, $Sr_{1-x}Ca_xTiO_3$, $Pb(Yb_{1/2}Nb_{1/2})O_3$, $Pb(Yb_{1/2}Ta_{1/2})O_3$, $Pb(Co_{1/2}W_{1/2})O_3$, $Pb(Sc_{1/2}Ta_{1/2})O_3$, $Na(Bi_{1/2}Ti_{1/2})O_3$ and $Bi(Mg_{1/2}Ti_{1/2})O_3$.

Each ferroelectric material is for example selected from the set made up of: $PbMg_{1/3}Nb_{2/3}O_3$, $(PbMg_{1/3}Nb_{2/3}O_3)_{1-x}(PbTiO3)_x$, $PbZn_{1/3}Nb_{2/3}O_3$, $(PbZn_{1/3}Nb_{2/3}O_3)_{1-x}(PbTiO3)_x$, $PbSc_{0.5}Nb_{0.5}O_3$, $(PbSc_{0.5}Nb_{0.5}O_3)_{1-x}(PbSc_{0.5}Ta_{0.5}O_3)_x$, $BaTi_{1-x}Zr_xO_3$, $Ba_{1-x}Sr_xTiO_3$, $BaTi_{1-x}Sn_xO_3$, $BaTiO_3$, $PbZr_{1-x}Ti_xO3$ and $BiFeO_3$.

The invention claimed is:

1. A neuromimetic network comprising a substrate, a set of neurons and a set of synapses,
at least one neuron comprising a first stack of superimposed layers in a first stacking direction, the first stack successively comprising, in the first stacking direction:
a first electrode supported by the substrate,
a first barrier layer made of an electrically insulating material, and
a second electrode,
the first electrode, the first barrier layer and the second electrode forming a first ferroelectric tunnel junction,
at least one synapse comprising a second stack of superimposed layers in at least a second stacking direction, the second stack successively comprising, in the second stacking direction:
a third electrode supported by the substrate,
a second barrier layer made of an electrically insulating material, and
a fourth electrode,
the third electrode, the second barrier layer and the fourth electrode forming a second ferroelectric tunnel junction.

2. The neuromimetic network according to claim 1, wherein the first barrier layer is made of a ferroelectric material and has a single-pole polarization cycle.

3. The neuromimetic network according to claim 1, wherein the first barrier layer is made from an anti-ferroelectric material.

4. The neuromimetic network according to claim 3, wherein the second barrier layer is made of a ferroelectric material made up of atoms of a set of elements and the anti-ferroelectric material making up the first barrier layer comprises atoms of each element from the set of elements, the anti-ferroelectric material further comprising atoms of an additional element not belonging to the set of elements.

5. The neuromimetic network according to claim 1, wherein the first electrode is made from a first conductive material and the second electrode is made from a second conductive material different from the first conductive material.

6. The neuromimetic network according to claim 1, wherein at least one neuron comprises an electro-resistive component having a variable electrical resistance, the electro-resistive component being electrically connected to an electrode of the corresponding first stack, the neuron being configured to receive an electric current passing through the electro-resistive component, the electric current further successively passing through all of the layers of the first stack in the first stacking direction.

7. A method for manufacturing a neuromimetic network according to claim 1, the method comprising the steps for:
obtaining a first set of first electrodes supported by the substrate, and a second set of electrodes, called third electrodes, supported by the substrate,
depositing an electrically insulating barrier layer on each first electrode and each third electrode,
forming an electrode, called second electrode, on each barrier layer of the first set to form a set of neurons, and forming a fourth electrode on each barrier layer of the second set to form a set of synapses, each barrier layer forming, with the corresponding electrodes, a ferroelectric tunnel junction.

8. A method for manufacturing a neuromimetic network according to claim 7, wherein each barrier layer deposited during the depositing step is made from a ferroelectric material,
the manufacturing method further comprising, before the forming step, a step for inserting atoms of at least one additional element into each barrier layer of the first set in order to transform the ferroelectric material of the barrier layers of the first set into an anti-ferroelectric material.

9. The method for manufacturing a neuromimetic network according to claim 8, wherein the insertion step comprises implanting atoms of the additional element into each barrier layer of the first set.

10. The method for manufacturing a neuromimetic network according to claim 7, wherein the forming step comprises:
- depositing an electrically conductive material, called second conductive material, on each barrier layer of the first set in order to form the corresponding second electrode, and
- depositing an electrically conductive material, called third conductive material, on each barrier layer of the second set in order to form the corresponding fourth electrode, the third conductive material being different from the second conductive material.

* * * * *

UNITED STATES PATENT AND TRADEMARK OFFICE
CERTIFICATE OF CORRECTION

PATENT NO. : 11,551,749 B2
APPLICATION NO. : 16/768549
DATED : January 10, 2023
INVENTOR(S) : Manuel Bibes It is certified that error appears in the above-identified patent and that said Letters Patent is hereby corrected as shown below:

On the Title Page

Item (72) The inventors read:
(72) Inventors: Manuel Bibes, Palaiseau (FR); Julie Grollier, Palaiseau (FR); Vincent Garcia, Palaisean (FR); Nicolas Locatelli, Orsay (FR)

Should read:
(72) Inventors: Manuel Bibes, Palaiseau (FR); Julie Grollier, Palaiseau (FR); Vincent Garcia, Palaiseau (FR); Nicolas Locatelli, Orsay (FR)

Signed and Sealed this
Sixteenth Day of May, 2023

Katherine Kelly Vidal
*Director of the United States Patent and Trademark Office*